United States Patent [19]

Terry

[11] 4,386,281
[45] May 31, 1983

[54] CIRCUIT FOR DETECTING LOSS OF SUPPLY VOLTAGE

[75] Inventor: Michael B. Terry, Dallas, Tex.

[73] Assignee: Mostek Corporation, Carrollton, Tex.

[21] Appl. No.: 273,841

[22] PCT Filed: Jan. 15, 1981

[86] PCT No.: PCT/US81/00060

§ 371 Date: Jan. 15, 1981

§ 102(e) Date: Jan. 15, 1981

[87] PCT Pub. No.: WO82/02463

PCT Pub. Date: Jul. 22, 1982

[51] Int. Cl.³ .......................................... H03K 17/08
[52] U.S. Cl. .............................. 307/200 B; 307/238.3; 307/238.6; 307/238.8; 307/296 R; 340/662; 340/663
[58] Field of Search ............... 307/200 A, 200 B, 296, 307/297, 491, 542, 362, 238.3, 238.6, 238.8; 340/636, 663, 662

[56] References Cited

U.S. PATENT DOCUMENTS 3,325,684 6/1967 Berger .......................... 307/200 A
4,099,068 7/1978 Kobayashi et al. ............ 307/200 A
4,232,236 11/1980 Yomogida et al. ................ 307/297

Primary Examiner—John S. Heyman

[57] ABSTRACT

A circuit (10) is provided for use in a telecommunications integrated circuit which has a memory for storing a telephone number. The circuit (10) essentially comprises a latch having differential nodes (22, 28). The circuit (10) serves to detect when the supply voltage provided between the supply terminals (12, 14) drops to a level which causes loss of the data stored in the integrated circuit memory. An output signal ($\overline{PUC}$) is driven to a low state upon detection of loss of power. For a slow return of supply power the nodes (22, 28) are respectively pulled to low and high states by current leakage through diodes (30, 36, 38) connected to the power terminals (12, 14). For a rapid supply voltage transition the latch node (28) is pulled high by capacitive coupling through a diode (30). This serves to set the latch in the condition where the output node (22) is at a low state to indicate loss of power. After generation of the $\overline{PUC}$ signal in the low state, external circuitry provides a reset signal ($\phi_s$) which serves to reset the latch of circuit (10) to indicate that the supply voltage has been provided continuously since receipt of the last reset command by the circuit (10).

9 Claims, 2 Drawing Figures

CIRCUIT FOR DETECTING LOSS OF SUPPLY VOLTAGE

TECHNICAL FIELD

The present invention pertains to voltage detection and more particularly to the setting of a latch upon the loss of supply voltage to a circuit.

BACKGROUND OF THE INVENTION

Integrated circuits are being developed to provide a wide range of functions in telephone applications. One application of such integrated circuits is to store one or more telephone numbers and recall the selected number for transmission over the telephone line in place of the user manually entering the number. But with the types of integrated circuits most applicable for telephone functions the stored number can be lost if the power supply to the integrated circuit should drop to a low level. The power for the integrated circuit is typically not provided locally but is received over telephone lines from a central office. The power voltages received at the telephones are subject to wide variations in amplitude and occasionally there is a total loss of the power voltage.

If a number should be stored in the integrated circuit memory and then lost due to a voltage reduction or transient a meaningless number will be introduced into the memory. This would not be the number which was previously stored. Thus, there exists a need for a circuit which can detect the loss of voltage supplied to the integrated circuit such that the circuit can be cognizant of the validity of the number stored in memory and therefore will not read an erroneous number from memory.

SUMMARY OF THE INVENTION

In a selected embodiment of the present invention a circuit is provided for detecting a reduction in the supply voltage thereto. The supply voltage is provided to the circuit through first and second power terminals. A latch circuit having first and second states is connected to the first and second power terminals and is also connected to receive a reset signal from an external circuit. Circuitry is provided for driving the latch to the first state when the supply voltage becomes less than a preset amplitude. Further circuitry is provided for driving the latch to the second state upon receipt of the reset signal. Thus, the latch is set to the first state when the supply power has been lost and the data stored in a memory is incorrect. The latch is set to the second state by the external circuitry after the external circuitry has taken appropriate steps in response to the lost supply voltage.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
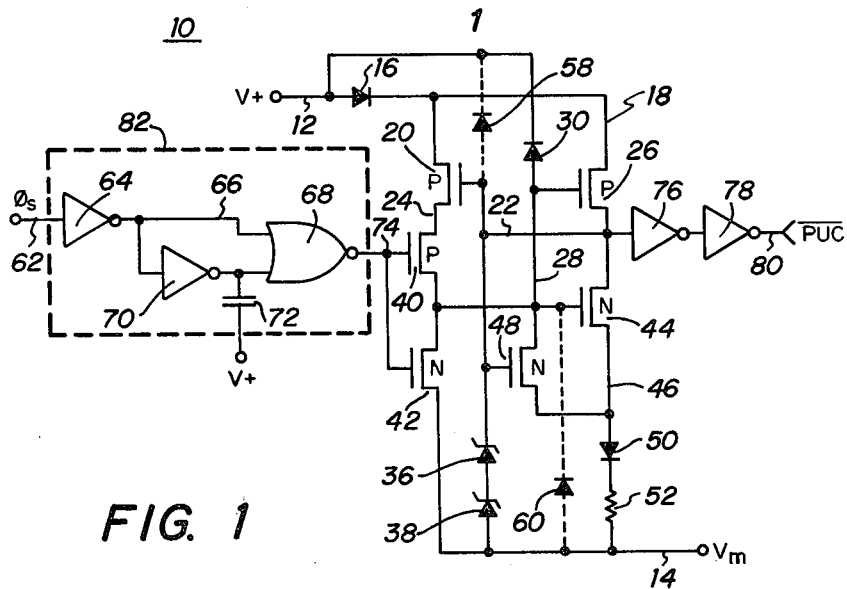
FIG. 1 is a schematic illustration of the circuit of the present invention.

The circuit of the present invention is illustrated as a schematic diagram in FIG. 1 and is generally designated by the reference numeral 10. A first power terminal 12 receives a supply voltage V+. A second power terminal 14 is connected to a supply voltage $V_M$. In a typical embodiment the voltage supply V+ is at approximately 4.0 volts and the voltage supply $V_M$ is at 0.0 volts. However, these voltages can vary substantially without changing the operation of circuit 10. The supply voltage provided to circuit 10 comprises the difference in the voltages at terminals 12 and 14. This is illustrated as the waveform shown for terminal 12 in FIG. 2.

Terminal 12 is connected to the anode of a diode 16 which has the cathode thereof connected to a node 18. A P-type transistor 20 has the source terminal connected to node 18, the gate terminal connected to a node 22 and the drain terminal connected to a node 24. Another P-type transistor 26 has the source terminal connected to node 18, the gate terminal connected to a node 28 and the drain terminal connected to node 22.

A diode 30 has the anode terminal connected to node 28 and the cathode terminal connected to terminal 12. Two zener diodes 36 and 38 are connected serially between terminal 14 and node 22. The anode terminal of diode 38 is connected to terminal 14 and the cathode terminal of diode 38 is connected to the anode terminal of diode 36. The cathode terminal of diode 36 is connected to node 22.

A P-type transistor 40 has the source terminal connected to node 24 and the drain terminal connected to node 28. An N-type transistor 42 has the drain terminal connected to node 28 and the source terminal connected to terminal 14.

An N-type transistor 44 has the drain terminal connected to node 22 and the source terminal connected to a node 46. The gate terminal of transistor 44 is connected to node 28. An N-type transistor 48 has the drain terminal thereof connected to node 28, the source terminal thereof connected to node 46 and the gate terminal thereof connected to node 22.

A diode 50 has the anode terminal connected to node 46 and the cathode terminal connected to a first terminal of a resistor 52. The second terminal of resistor 52 is connected to terminal 14. In one embodiment of the present invention diode 50 is fabricated as a bipolar transistor and resistor 52 is included as a current limiting impedance.

A parasitic diode 58 has the anode terminal connected at node 22 and the cathode terminal connected to terminal 12. Another parasitic diode 60 has the anode terminal connected to power terminal 14 and the cathode connected to node 28.

A externally supplied reset signal $\phi_S$ is provided to a terminal 62 which serves as the input to an inverter 64. The output of inverter 64 is connected to a node 66 which provides a first input to a NOR gate 68. Node 66 is also connected to the input of an inverter 70. The output of inverter 70 is connected as the second input to NOR gate 68. A capacitor 72 is connected between the output of inverter gate 70 and the power terminal V+. The output of NOR gate 68 is connected to a node 74 which is in turn connected to the gate terminals of transistors 40 and 42.

Node 22 is connected to the input of an inverter 76 which has the output thereof connected to the input of another inverter 78. The output of inverter 78 is connected to a terminal 80 which provides a power up clear (PUC) signal to other elements of the integrated circuit which includes the circuit 10. The signal at terminal 80 corresponds to the signal on node 22. As further described below, the $\overline{PUC}$ signal is driven to a low state when the voltage between terminals 12 and 14 has dropped to such a level that a number stored in memory would be lost. The $\overline{PUC}$ signal is driven to a high state when a reset command is received from external circuitry (not shown) and provided through line 62 to circuit 10.

The circuit of the present invention operates advantageously as a part of an integrated circuit which is used in a telephone application. The remainder of the integrated circuit includes a memory (not shown) and other external circuitry (not shown). When the voltage between terminals 12 and 14 drops to an inoperative level the information stored in the memory, typically a telephone number, will generally be lost. When the external circuitry receives the $\overline{PUC}$ signal in the low state, action is taken to reset the external circuitry to show that there is no valid information stored in the memory. Next, after this reset condition has occurred the reset signal $\phi_S$ is supplied from the external circuitry to the circuit 10 through terminal 62. This serves to reset circuit 10 and thus drive the $\overline{PUC}$ signal to the high state.

Figure 2:
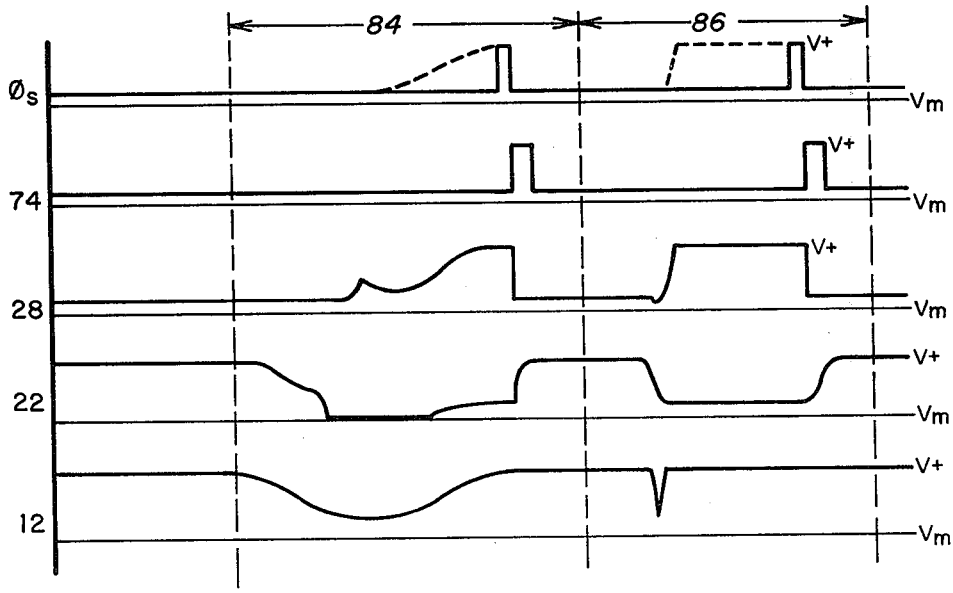
FIG. 2 is an illustration of waveforms which occur in the circuit of FIG. 1.

Operation of the circuit 10 of the present invention is now described in detail with reference to FIGS. 1 and 2. The circuit elements shown within dashed line 82 constitute a one-shot circuit which receives the externally supplied reset signal $\phi_S$ and generates a pulse signal having a fixed time duration following the downward transition of the $\phi_S$ signal. As shown in FIG. 2, during a power up sequence the $\phi_S$ signal can either be initially set up at a high state as indicated by the dashed lines or can be initially set up in a low state as indicated by the solid lines. In either case the reset signal $\phi_S$ has a downward transition which produces each of the pulses shown for the signal waveform of node 74.

The waveforms shown in FIG. 2 are divided to show two operational modes which are indicated by the sections 84 and 86. Section 84 represents a slow decay and return of the power signal as represented by the waveform at terminal 12 and section 86 represents a sudden loss of the power as shown by the sudden dip of the power signal at terminal 12.

The operation mode of circuit 10 regarding the slow loss of supply voltage as indicated in section 84 is now described. Section 84 illustrates the operation of circuit 10 both when power is lost during normal operation and when power is provided initially. The nodes 22 and 28 are initially floating since transistors 26, 44, 48, 40 and 42 are turned off due to insufficient supply voltage. As the supply voltage is slowly provided to circuit 10 there will be a leakage of current through diode 30 which will tend to pull node 28 up to the voltage level of terminal 12. Similarly, there is a current leakage through diodes 36 and 38 which tends to pull node 22 to the voltage level of terminal 14. As the supply voltage increases and the voltage differential between nodes 22 and 28 increases, transistor 44 will be turned on thereby pulling node 22 down to within one diode threshold ($V_D$) of $V_M$. When node 22 goes low transistor 20 is turned on to pull node 24 high. Transistor 40 is turned on by the low state of the reset signal at node 74. When transistors 20 and 40 are turned on, node 28 is pulled to a high voltage state, approximately one $V_D$ from the voltage $V+$.

Transistor 42 is turned off by the low state at node 74 thus isolating node 28 from terminal 14. Transistor 48 is likewise turned off to isolate node 28 from terminal 46. Transistor 26 is turned off by the high voltage state on node 28 to isolate node 22 from node 18. Thus as the voltage supply provided to terminals 12 and 14 slowly increases node 22 will be driven to a low state thus setting the $\overline{PUC}$ signal at the low state to indicate that power has been lost to circuit 10. As noted above this indicates that the information stored in the integrated circuit memory has probably been lost. Upon receipt of the PUC signal in the low state the integrated circuit sets latches (not shown) showing that the stored number is invalid.

After receipt of the $\overline{PUC}$ signal in the low state the external circuitry provides the external reset signal $\phi_S$ through terminal 62 to circuit 10. The one-shot circuit within dashed line 82 generates the pulse shown for node 74 within section 84 of FIG. 2. When node 74 goes high, transistor 40 is turned off and transistor 42 is turned on. When transistor 42 is turned on, node 28 is connected to the power terminal 14 therefore pulling node 28 to a low voltage state as shown in FIG. 2. When node 28 goes low, transistor 44 is turned off and transistor 26 is turned on. When transistor 26 is turned on, node 22 is pulled to a high voltage state which serves to turn off transistor 20 and turn on transistor 48 thereby holding node 28 at a low voltage state. The reset signal received through node 74 thus resets circuit 10 to the state indicating that power has not been lost to the memory since receipt of the reset signal. The transistors 20, 26, 40, 42, 44 and 48 constitute a two state latch in which nodes 22 and 28 are driven to opposite states.

The condition is now described in which the supply voltage for circuit 10 is suddenly lost and regained due to a transient on the supply lines. This is shown in section 86 in FIG. 2. Note at the start of section 86 that node 22, which is the first node of the latch and logically corresponds to the $\overline{PUC}$ signal, is high indicating that power has been continuously supplied to circuit 10 since receipt of the last reset pulse. Node 28, the second node of the latch, is set to the opposite state. When the supply voltage indicated for node 12 in FIG. 2 makes a sudden downward transition and reaches the state where there is insufficient voltage between nodes 12 and 14, one of transistors 26 or 48, will be turned off depending on the relative thresholds of transistors 20 and 48. If transistor 48 is turned off before transistor 26 node 28 will be driven downward by capacitive coupling through diode 30. However, the maximum negative excursion of node 28 is limited by the clamping effect of diode 60. But if transistor 26 is turned off before transistor 48, the voltage on node 22 will be sustained high due to the capacitance of diodes 36 and 38. Under these conditions, due to the clamping, there will be insufficient gate drive for the one of the transistor, 26 or 48, which was not turned off. Thus, node 28 can be driven no more than one $V_D$ below the voltage at terminal 14. Diode 58 restricts the positive amplitude voltage at node 22 to one $V_D$ above the voltage at terminal 12. Due to the clamping effects of diodes 58 and 60, transistors 26 and 48 are both in the nonconductive state when the supply voltage falls to a sufficient low amplitude.

As the supply voltage makes a sudden upward transition, node 28 will be pulled upward by capacitive coupling through diode 30. As node 28 is pulled to a high level, transistor 26 remains off and transistor 44 is turned on. When transistor 44 is turned on, node 22 is pulled to a low voltage level which serves to turn off transistor 48 thereby isolating node 28 from the power terminal 14. The low voltage on node 22 turns on transistor 20 which couples node 28 through transistors 20 and 40 to node 18 thereby pulling node 28 to a high voltage state. When node 22 is driven to the low level, the $\overline{PUC}$ signal is likewise driven to a low level to indicate that power has been lost and that the data stored in the integrated circuit memory is likely to be in error. The reset operation then occurs in the same manner as described above.

The low supply voltage threshold of the circuit 10, is the highest $V_T$ of either transistor 26 or 48 plus one $V_D$ for the slow loss of supply voltage condition. For the rapid loss of supply voltage the low supply voltage threshold is essentially the highest $V_T$ of transistors 26 or 48. In the memory cells (not shown) the data is retained as long as the supply voltage is at least equal to the highest $V_T$ of either the P on N-type memory transistor. The circuit 10 transistors will have essentially the same thresholds as the memory cell transistors, therefore the low voltage supply threshold is equal to or greater than the minimum supply voltage required for data retention within the memory cells. This provides a margin of safety to insure that valid data is maintained in the memory cells by detecting any voltage supply loss sufficient to cause loss of data in the memory cells.

Note that circuit 10 operates in two different modes to detect loss of the supply voltage. In the first mode indicated by section 84 in FIG. 2, a slow loss of supply voltage is detected by the leakage of current through diodes connected between the latch nodes and the power terminals. A sudden loss of the supply voltage is shown in section 86 of FIG. 2 and is detected by capacitive coupling to diodes connected between the latch nodes and the power terminals. The parasitic diodes fabricated as an integral part of the circuit serve to limit voltage excursions and produce the desired latch transition.

A significant feature of the circuit of the present invention is that it draws essentially no static current thereby eliminating the power dissipation of circuits previously used for similar functions. Further, there is no requirement for external components such as capacitors and resistors.

Although one embodiment of the invention has been illustrated in the accompanying drawings and described in the foregoing Detailed Description, it will be understood that the invention is not limited to the embodiment disclosed, but is capable of numerous rearrangements, modifications and substitutions without departing from the scope of the invention.

I claim:

1. A circuit for detecting a reduction and increase in the supply voltage thereto, comprising:
   first and second power terminals adapted to receive said supply voltage:
   a latch circuit having cross-coupled first and second nodes which are driven to set said latch circuit to a first state or a second state, said latch circuit connected to said first and second power terminals;
   first means connected between said latch circuit and said first power terminal for switching said latch circuit to said first state in response to rapid rate increases in said supply voltage;
   second means connected between said latch circuit and said second power terminal for switching said latch circuit to said first state in response to slow rate increases in said supply voltage increases; and
   means for driving said latch circuit to said second state upon receipt of a reset signal.

2. The circuit recited in claim 1 wherein said first means for driving comprises a first diode having the anode terminal thereof connected to said second node and the cathode terminal thereof connected to said first power terminal, and said second means for driving comprises at least one second diode connected in series between said first node and said second power terminal wherein the anode terminal of said second diode is connected to said second power terminal and the cathode terminal of said second diode is connected to said second node.

3. A circuit for detecting a reduction in the supply voltage thereto, comprising:
   first and second power terminals adapted to receive said supply voltage;
   a latch circuit having first and second states, said latch circuit connected to said first and second power terminals and adapted to receive a reset signal;
   means for driving said latch circuit to said first state when said supply voltage becomes less than a preset amplitude;
   means for driving said latch to said second state upon receipt of said reset signal;
   wherein said latch circuit comprises:
   a first P-type transistor having the source terminal thereof coupled to said first power terminal and the gate terminal thereof connected to a first node;
   a second P-type transistor having the source terminal thereof coupled to said first power terminal, the drain terminal thereof coupled to said first node, and the gate terminal thereof connected to a second node;
   a first N-type transistor having the drain terminal thereof connected to said first node, the source terminal thereof coupled to said second power terminal and the gate terminal thereof connected to said second node;
   a second N-type transistor having the drain terminal thereof connected to said second node, the source terminal thereof coupled to said second power terminal and the gate terminal thereof connected to said first node;
   a third P-type transistor having the source terminal thereof connected to the drain terminal of said first P-type transistor and the gate terminal thereof connected to receive said reset pulse; and
   a third N-type transistor having the drain terminal thereof connected to the drain terminal of said third P-type transistor, the gate terminal thereof connected to receive said reset signal and the source terminal thereof connected to said second power terminal.

4. The circuit recited in claim 3 including a one-shot circuit connected to receive an externally supplied reset signal and generate at the output thereof said reset signal as a fixed duration pulse, and the output of said one-shot circuit connected to the gate terminals of said third P-type transistor and said third N-type transistor.

5. The circuit recited in claim 3 including:

a first diode having the anode terminal thereof connected to said first node and the cathode terminal thereof connected to said first power terminal; and a second diode having the anode terminal thereof connected to said second power terminal and the cathode terminal thereof connected to said second node.

6. A circuit for detecting a reduction in the supply voltage thereto, comprising:

first and second power terminals for providing said supply voltage to said circuit;

a first P-type transistor having the source terminal thereof connected to a third node and the gate terminal thereof connected to a first node;

a second P-type transistor having the source terminal thereof coupled to said third node, the drain terminal thereof coupled to said first node, and the gate terminal thereof connected to a second node;

a first N-type transistor having the drain terminal thereof connected to said second node, the gate terminal thereof connected to said first node and the source terminal thereof connected to a fourth node;

a second N-type transistor having the drain terminal thereof connected to said second node, the source terminal thereof connected to said fourth node and the gate terminal thereof connected to said second node;

a third P-type transistor having the source terminal thereof connected to the drain terminal of said first P-type transistor and the gate terminal thereof connected to receive said reset pulse;

a third N-type transistor having the drain terminal thereof connected to the drain terminal of said third P-type transistor, the gate terminal thereof connected to receive said reset signal and the source terminal thereof connected to said second power terminal;

a first diode having the anode terminal thereof connected to said second node and the cathode terminal thereof connected to said first power terminal;

second and third diodes connected in series between said first node and said second power terminal wherein the anode terminal of said second diode is connected to said second power terminal and the cathode terminal of said third diode is connected to said second node;

a fourth diode having the anode terminal thereof connected to said first power terminal and the cathode terminal thereof connected to said third node;

a fifth diode having the anode terminal thereof connected to the source terminal of said second N-type transistor;

a resistor connected between the cathode terminal of said fifth diode and said second power terminal;

a one-shot circuit connected to receive an externally supplied reset signal and generate at the output of said one-shot circuit said reset signal as a fixed duration pulse, and the output of said one-shot circuit connected to the gate terminals of said third P-type transistor and said third N-type transistor;

a first parasitic diode having the anode terminal thereof connected to said first node and the cathode terminal thereof connected to said first power terminal; and a second parasitic diode having the anode terminal thereof connected to said second power terminal and the cathode terminal thereof connected to said second node.

7. A method for detecting a reduction in the supply voltage to a circuit, comprising the steps of:

pulling a first node of a latch toward a second voltage state due to leakage current through a first diode connected between said first node and a second power terminal;

pulling a second node of said latch toward a first voltage state due to leakage current through a second diode connected between said second node and a first power terminal;

coupling said first and second nodes such that said nodes are driven to opposite states;

driving said latch to provide a first output state when the supply voltage provided through said first and second power terminals is increased from a low amplitude to the operational amplitude for said circuit due to current leakage through said diodes, wherein said latch produces said first output state when said first node is at said second voltage state and said second node is at said first voltage state;

driving said latch to provide a first output state due to capacitive coupling between said first power terminal and said second node when said supply voltage makes a substantially fast sequence of negative and positive transitions; and driving said latch to produce a second output state upon receipt of a reset signal which causes said second node to be connected to said second power terminal thereby pulling said second node to said second voltage state.

8. The method recited in claim 7 including the steps of:

clamping said first power terminal to limit the voltage excursion of said first power terminal below the voltage of said second node; and clamping said second node to limit the voltage excursion of said second node below the voltage of said second power terminal.

9. The method recited in claim 7 including the step of blocking static current flow between said first and second power terminals.

* * * * *